United States Patent
Mills et al.

(10) Patent No.: US 9,532,476 B2
(45) Date of Patent: Dec. 27, 2016

(54) SWITCHING ASSEMBLY AND INTERCONNECT ASSEMBLY THEREFOR

(71) Applicant: Labinal, LLC, Denton, TX (US)

(72) Inventors: Patrick Wellington Mills, Bradenton, FL (US); James Michael McCormick, Bradenton, FL (US); Jeffrey Alan Muckefuse, Bradenton, FL (US)

(73) Assignee: LABINAL, LLC, Denton, TX (US)

( * ) Notice: Subject to any disclaimer, the term of this patent is extended or adjusted under 35 U.S.C. 154(b) by 66 days.

(21) Appl. No.: 14/623,149

(22) Filed: Feb. 16, 2015

(65) Prior Publication Data

US 2015/0237758 A1 Aug. 20, 2015

Related U.S. Application Data

(60) Provisional application No. 61/940,988, filed on Feb. 18, 2014.

(51) Int. Cl.
*H05K 7/00* (2006.01)
*H05K 7/12* (2006.01)
*H01R 3/00* (2006.01)

(52) U.S. Cl.
CPC . *H05K 7/12* (2013.01); *H01R 3/00* (2013.01)

(58) Field of Classification Search
USPC ............... 361/728–730, 752, 759, 792, 796, 799,361/816, 818
See application file for complete search history.

(56) References Cited

U.S. PATENT DOCUMENTS

| | | | | |
|---|---|---|---|---|
| 3,986,780 A | * | 10/1976 | Nivet | F16B 21/02 403/252 |
| 4,632,497 A | | 12/1986 | Boysen | |
| 5,688,093 A | * | 11/1997 | Bowers | F16B 5/10 411/544 |
| 5,754,412 A | * | 5/1998 | Clavin | H05K 7/142 174/138 D |
| 6,267,543 B1 | * | 7/2001 | David | F16B 21/02 411/549 |
| 6,308,394 B1 | * | 10/2001 | Boe | H05K 7/142 174/138 G |

(Continued)

FOREIGN PATENT DOCUMENTS

| | | |
|---|---|---|
| EP | 2680289 | 1/2014 |
| FR | 2802332 | 6/2001 |

OTHER PUBLICATIONS

International Search Report filed in PCT/US2015/016038 mailed May 4, 2015.

*Primary Examiner* — Hung S Bui
(74) *Attorney, Agent, or Firm* — Rankin, Hill & Clark LLP

(57) ABSTRACT

An interconnect assembly for a switching assembly in which the switching assembly includes a bus bar and an electromagnetic switching device having a contactor bus. The interconnect assembly is structured to mechanically couple and electrically connect the contactor bus to the bus bar. The interconnect assembly includes a socket member structured to engage the bus bar, a post assembly that includes a post member structured to extend through the contactor bus, in which at least a portion of the post member extends into the socket member, and a locking member disposed on the post member. The locking member is structured to extend through and removably engage the socket member in order to mechanically couple and electrically connect the contactor bus to the bus bar.

18 Claims, 5 Drawing Sheets

(56) References Cited

U.S. PATENT DOCUMENTS

| | | | | |
|---|---|---|---|---|
| 6,338,649 B1* | 1/2002 | Smith | ............... | H01R 11/287 |
| | | | | 411/552 |
| 7,927,730 B2* | 4/2011 | Ge | ............... | H01M 2/1066 |
| | | | | 429/97 |
| 8,353,397 B2* | 1/2013 | Trapp | ............... | B65D 73/0014 |
| | | | | 206/1.5 |
| 8,376,287 B2* | 2/2013 | Zhang | ............... | B21C 47/143 |
| | | | | 248/56 |
| 2012/0128409 A1* | 5/2012 | Inayama | ............... | F01N 13/008 |
| | | | | 403/288 |

* cited by examiner

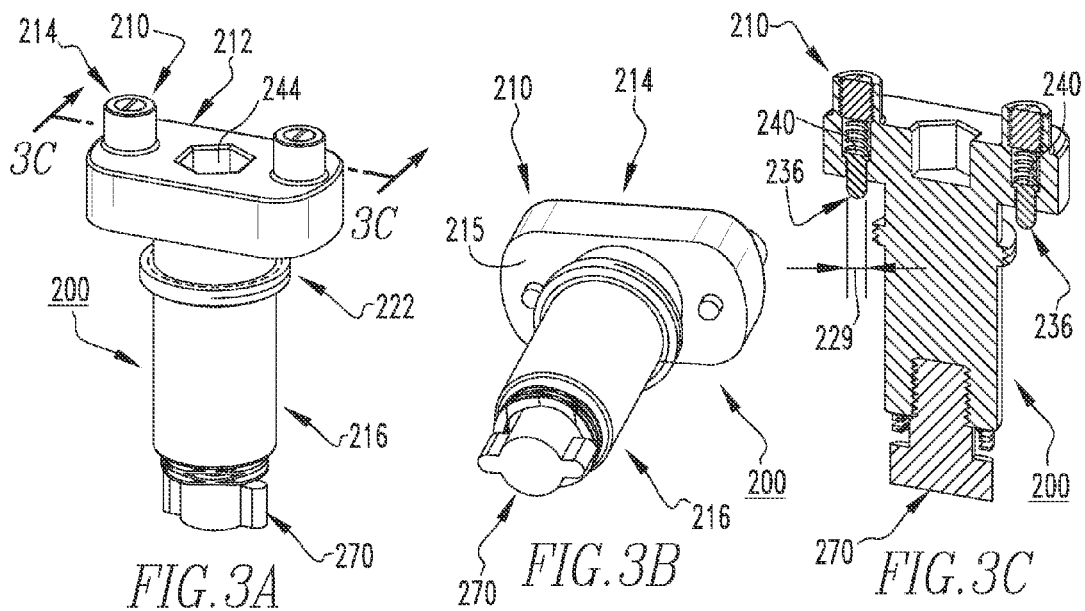
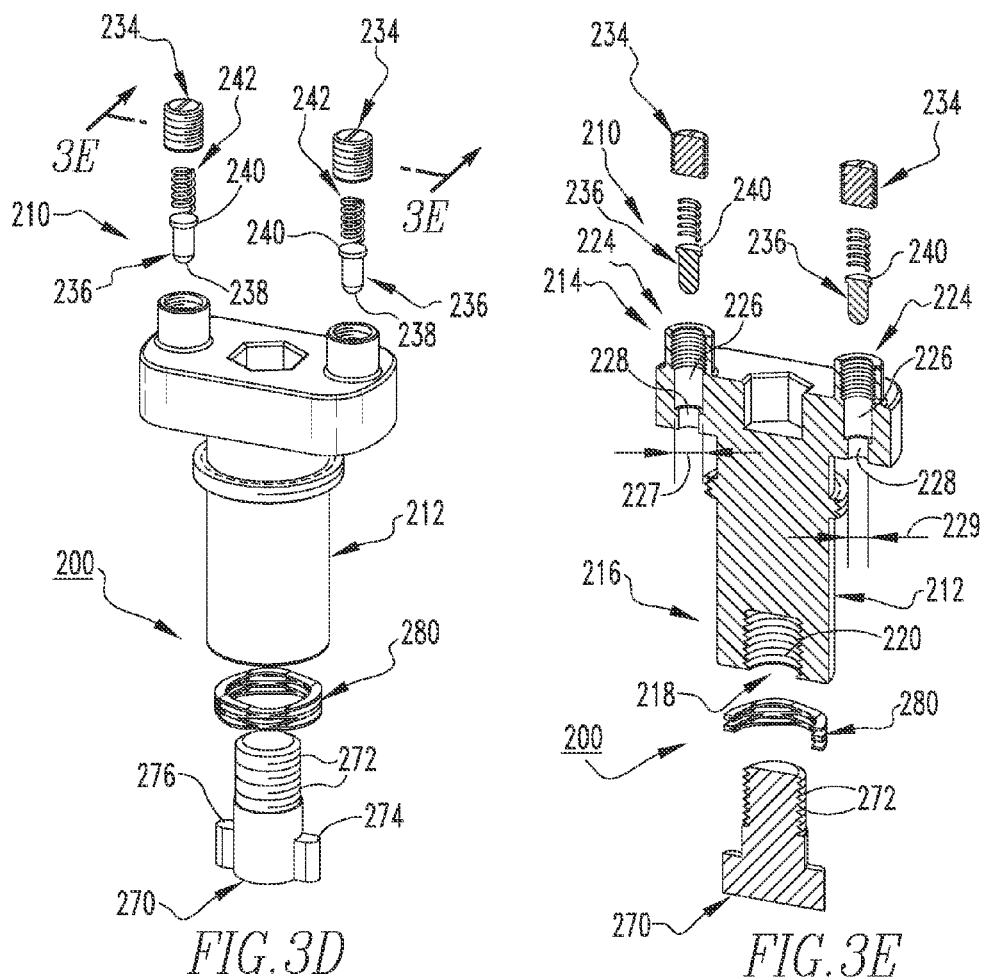

SWITCHING ASSEMBLY AND INTERCONNECT ASSEMBLY THEREFOR

BACKGROUND

Field

The disclosed concept pertains generally to switching assemblies and, more particularly, to switching assemblies including electromagnetic switching devices such as for example, power switching contactors. The disclosed concept also pertains to interconnect assemblies for switching assemblies.

Background Information

Electromagnetic switching devices, such as for example power switching contactors, are often used to electrically couple a power source to a load such as an electrical motor or other suitable load. Known power switching contactors are commonly mounted to ridged bus bars when current is increased above 150 amperes.

FIG. 1 shows a known power switching contactor 2 that includes a pair of contactor buses 4,6. As seen, the contactor buses 4,6 are structured to be mounted to a corresponding pair of bus bars 8,10. Such mounting is traditionally done by bolting the contactor buses 4,6 to the bus bars 8,10 with conventional thread bolts and locking hardware. Schematically shown in FIG. 1 are a pair of bolts 12,14 and a corresponding pair of nuts 16,18 that are structured to mechanically couple and electrically connect the contactor buses 4,6 to the bus bars 8,10. In this manner, current is primarily able to flow from the power switching contactor 2 to the bus bars 8,10 by virtue of the clamping force and resultant contact between the contactor buses 4,6 and the bus bars 8,10.

A known problem with the aforementioned method of mounting is that threads in the ridged bus bars become easily damaged. Additionally, once the bolts are threaded, plating is removed from the bolts, which leads to galvanic corrosion. Also, aluminum bus bars have large coefficients of thermal expansion which may cause clamp forces to decrease over time, creating a relatively high resistance connection that leads to overheating. Finally, such threaded connections require labor to install, remove and/or repair.

There is thus room for improvement in switching assemblies and in interconnect assemblies therefor.

SUMMARY

According to one aspect, an interconnect assembly for a switching assembly is disclosed. The switching assembly includes a bus bar and an electromagnetic switching device having a contactor bus. The interconnect assembly is structured to mechanically couple and electrically connect the contactor bus to the bus bar. The interconnect assembly includes a socket member structured to engage the bus bar, a post assembly that includes a post member structured to extend through the contactor bus, in which at least a portion of the post member extends into the socket member, and a locking member disposed on the post member. The locking member is structured to extend through and removably engage the socket member in order to mechanically couple and electrically connect the contactor bus to the bus bar.

According to another aspect a switching assembly includes a number of bus bars, an electromagnetic switching device that includes a number of contactor buses, and at least one interconnect assembly for mechanically coupling and electrically connecting a corresponding one of the bus bars to a corresponding one of the contactor buses. The at least one interconnect assembly includes a socket member engaging the corresponding one of the bus bars, a post assembly that includes a post member extending through the corresponding one of the contactor buses, at least a portion of the post member extending into the socket member, and a locking member disposed on the post member. The locking member extends through and removably engages the socket member in order to mechanically couple and electrically connect the corresponding one of the contactor buses to the corresponding one of the bus bars.

BRIEF DESCRIPTION OF THE DRAWINGS

A full understanding of the disclosed concept can be gained from the following description of the preferred embodiments when read in conjunction with the accompanying drawings in which:

FIGS. 3A-3E are different views of a first portion of an interconnect assembly in accordance with an embodiment of the disclosed concept;

DESCRIPTION OF TUE PREFERRED EMBODIMENTS

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the statement that two or more parts or components "engage" one another shall mean that the parts touch and/or exert a force against one another either directly or through one or more intermediate parts or component.

Figure 1:
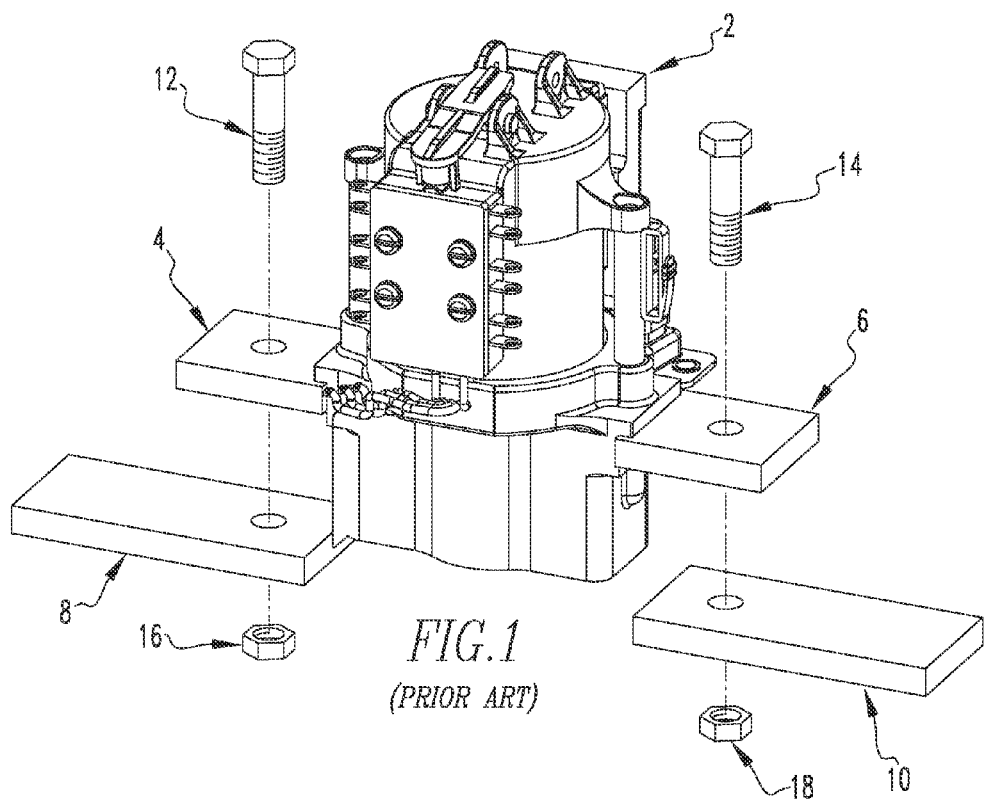
FIG. 1 is an exploded isometric view of a known electromagnetic switching device and threaded bolt design for mounting the electromagnetic switching device to a pair of bus bars.
Figure 2:
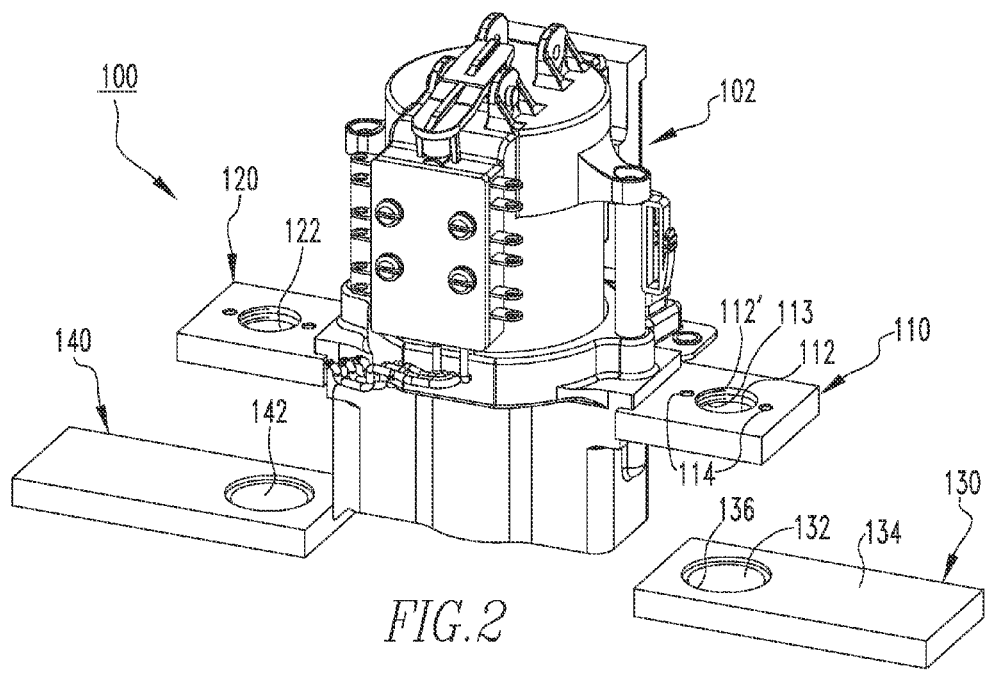
FIG. 2 is an isometric view of a portion of a switching assembly in accordance with an embodiment of the disclosed concept.

FIG. 2 shows a portion of a switching assembly 100 that includes an electromagnetic switching device (e.g., without limitation, single-phase power switching contactor 102). The power switching contactor 102 includes a pair of contactor buses 110,120 that are structured to be electrically connected and mechanically coupled to a corresponding pair of bus bars 130,140. As seen, the contactor buses 110,120 each have a corresponding through hole 112,122 and the bus bars 130,140 each have a corresponding through hole 132, 142.

FIGS. 3A-3E show a portion of an interconnect assembly 200 for the switching assembly 100. The interconnect assembly 100 is structured to extend through the through holes 112,132 to electrically connect and mechanically couple the contactor bus 110 to the bus bar 130. As seen, the interconnect assembly 200 includes a post assembly 210 and a locking member 270 located on the post assembly 210. The post assembly 210 includes a post member 212 that is preferably made of copper or aluminum. In operation, the post member 212 is structured to extend through the through hole 112 of the contactor bus 210. Additionally, the post member 212 has a threaded portion 222 and the through hole 112 of the contactor bus 110 (FIG. 2) has a threaded portion 112' and a receiving portion 113. During assembly, the threaded portion 222 of the post member 212 is threaded entirely through the threaded portion 112' of the contactor bus 110 until it fits within the receiving portion 113. As the receiving portion 113 of the contactor bus 110 has a larger diameter than the threaded portion 112' of the contactor bus 110, the threaded portion 222 of the post member 212 is not threaded to the contactor bus 110 once the interconnect assembly 200 is fully installed. Furthermore, the threaded portion 222 of the post member 212 advantageously allows the post member 212 to be retained by the power switching contactor 102 during shipment and installation.

Additionally, the post member 212 includes a head portion 214 and an end portion 216 opposite the head portion 214. As seen, the end portion 216 includes a recess 218 having a threaded portion 220. The locking member 270 includes a number of threads 272 that are structured to engage the threaded portion 220. In this manner, the locking member 270 is threadably disposed within the recess 218 to mechanically couple the locking member 270 to the post member 212. Continuing to refer to FIGS. 3A-3E, the post member 212 includes a tightening socket (e.g., without limitation, hex socket 244). In operation, the hex socket 244 is employed by a user to tighten the post member 212 to the locking member 270, advantageously providing for a clamping force between the contactor bus 110 and the bus bar 130 (FIGS. 2, 6A, 6B and 7).

Referring to FIG. 3E, the post member 212 includes a number of apertures 224, each having a corresponding first portion 226 with a first diameter 227 and a corresponding second portion 228 with a second diameter 229 less than the first diameter 227 of the first portion 226. As seen in FIG. 3D, the post assembly 210 further includes a dampening assembly 232 structured to resist undesired motion due to operation of the switching assembly 100 (FIGS. 2, 6A, 6B and 7) and also provide an additional clamp force between the contactor bus 110 and the bus bar 130 once the locking member 270 is located within a socket member 250 (discussed below). The dampening assembly 232 includes a number of set screws 234 structured to be located in the corresponding first portions 226, a number of detent posts 236 structured to extend through the corresponding second portions 228, and a number of springs 242 structured to be located between the set screws 234 and the detent posts 236.

As seen, the detent posts 236 each include a corresponding rounded end portion 238. Referring to FIG. 2, the contactor bus 110 includes a number of depressions 114. In operation, the rounded end portions 238 of the detent posts 236 are structured to extend into the depressions 114 and engage the contactor bus 110. Additionally, each of the detent posts 236 includes a head portion 240 opposite the rounded end portion 238. As will be appreciated with reference to FIGS. 3C, 3D, and 3E, the head portions 240 are larger than the aforementioned second diameter 229 of the second portions 228 of the apertures 224. Furthermore, the set screws 234, along with the springs 242, are structured to keep the detent posts 236 in place.

Figure 7:
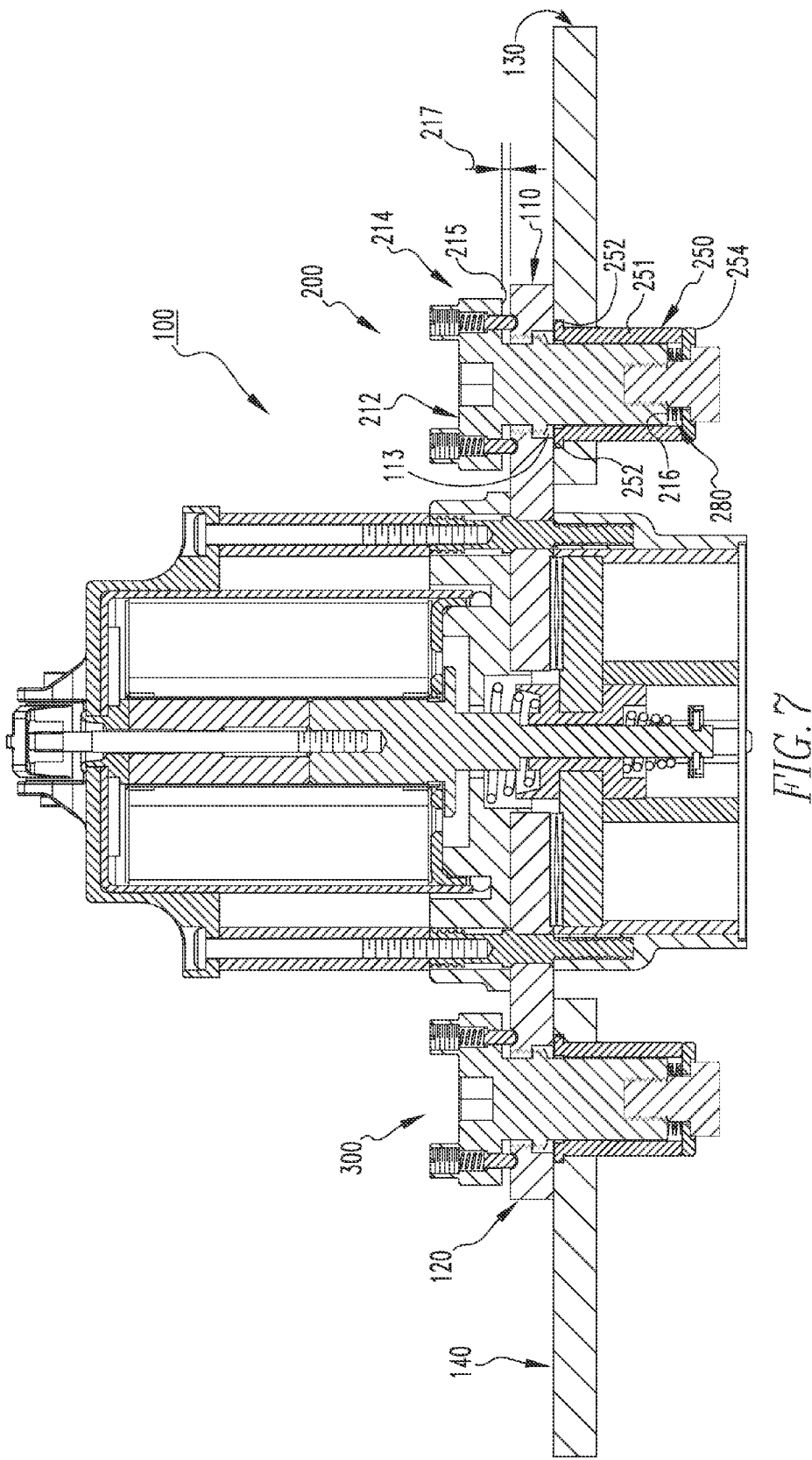
FIG. 7 is an assembled section view of the switching assembly and interconnect assembly therefor of FIG. 6B.

As best shown in FIG. 7, the head portion 214 of the post member 212 includes a surface 215 that faces the contactor bus 110, the surface 215 being spaced a distance 217 from the contactor bus 110. Accordingly, if the contactor bus 110 oscillates due to operation of the power switching contactor 102, the set screws 234, springs 242, and detent posts 236 advantageously operate to reduce or absorb contact between the head portion 214 of the post member 212 and the contactor bus 110. In other words, if the contactor bus 110 moves towards the surface 215 of the post member 212, the detent posts 236 exert a force against the contactor bus 110, by virtue of the fact that the springs 242 compress, as they are fixed at one end by the set screws 234. Additionally, although the disclosed concept has been described in association with two set screws 234, two detent posts 236, and two springs 242, it is within the scope of the disclosed concept for a dampening assembly (not shown) to have any number and/or configuration of set screws, detent posts, and/or springs.

Figure 4A:
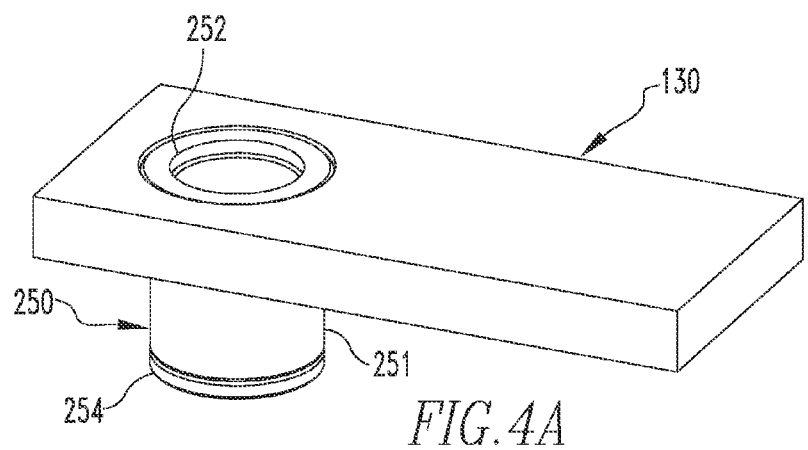
FIGS. 4A and 4B are top and bottom isometric views, respectively, of a second portion of the interconnect assembly for use with the first portion shown in FIGS. 3A-3E.
Figure 4B:
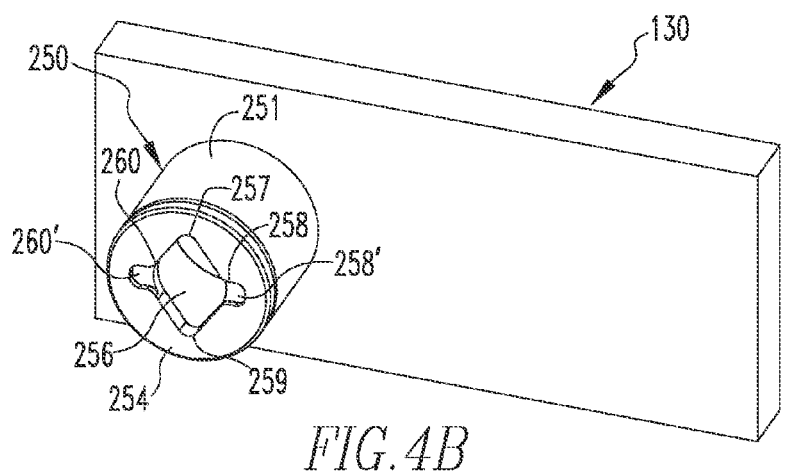
Figure 5:
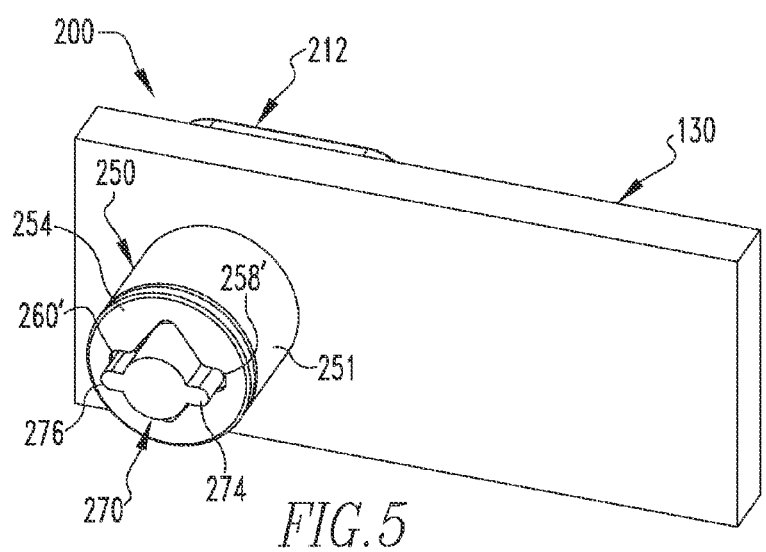
FIG. 5 is a bottom isometric view of a bus bar, shown employing the interconnect assembly of FIGS. 3A-4B.

The interconnect assembly 200 further includes the socket member 250 that is structured to engage the bus bar 130 (FIGS. 4A, 4B and 5). The socket member 250 is etched and formed into shape, preferably being made from copper, and more preferably being made from beryllium copper. Referring to the section view of the switching assembly 100 seen in FIG. 7, it will be appreciated that a portion of the post member 212 extends into and engages the socket member 250. Furthermore, although the interconnect assembly 200 provides for a clamp force between the contactor bus 110 and the bus bar 130, electrical conduction between the contactor bus 110 and the bus bar 130 is primarily through the post member 212 and the embedded socket 250. In this manner, electrical conductivity is advantageously unaffected by relatively large coefficients of thermal expansion of the contactor bus 110 and the bus bar 130.

As seen in FIG. 4A and FIG. 7, the socket member 250 includes a body portion 251 having an annular projection 252. Referring to FIG. 2, the bus bar 130 includes a surface 134 and an annular groove 136. The annular groove 136 extends from the surface 134 partially into the bus bar 130 and is concentric with the through hole 132. In operation, the annular projection 252 (FIG. 4A and FIG. 7) is structured to be concentric with, and located in, the annular groove 136 in order to retain the socket member 250 in the through hole 132. Preferably, the annular projection 252 is welded to the bus bar 130 proximate the annular groove 136. In this manner, the socket member 250 is structured to be coupled to the bus bar 130, without employing threads, advantageously providing for decreased electrical resistance between the contactor bus 110 and the bus bar 130, as there will be essentially no loosening of the connection between the bus bar 130 and the socket member 250 over time.

Referring to FIG. 4A, the socket member 250 further includes a receiving portion 254 located opposite the annular projection 252. The receiving portion 254 is coupled to the body portion 251, preferably being laser welded to the body portion 251. Additionally, as seen in FIGS. 3A-3E, the interconnect assembly 200 includes a spring (e.g., without limitation, wave compression spring 280). Referring to FIG. 7, the wave compression 280 is located between the end portion 216 of the post member 212 and the receiving portion 254 of the socket member 250, the locking member 270 extending through the wave compression spring 280. In this manner, the wave compression spring 280 forces the locking member 270 into the recess 218, advantageously providing additional clamping force between the contactor bus 110 and the bus bar 130. Additionally, although the disclosed concept has been described in association with the single wave compression spring 280, it is within the scope of the disclosed concept for an interconnect assembly (not shown) to have any suitable alternative type and/or number of springs.

The receiving portion 254 includes an aperture e.g., without limitation, generally rhombus-shaped aperture 256). The example generally rhombus-shaped aperture 256 includes first, second, third and fourth apexes 257,258,259, 260. The receiving portion 254 further includes a groove 258' located near apex 258 and a groove 260' located near the opposite apex 260. Referring to FIG. 5, the locking member 270 includes a first lateral protrusion 274 and a second lateral protrusion 276 located opposite the first lateral protrusion 274. Each of the lateral protrusions 274, 276 is shaped to generally correspond with a corresponding one of the grooves 258',260' such that when the interconnect assembly 200 is assembled, as shown in FIG. 5, the first and second lateral protrusions 274,276 are located in the grooves 258',260'.

Before being assembled, the lateral protrusions 274,276 are structured to be located near the apexes 257,259. In order to be assembled, the post member 212 needs to be rotated (e.g., clockwise or counterclockwise) approximately a quarter turn so that the lateral protrusions 274,276 rotate from the apexes 257,259 into the grooves 258',260', advantageously fastening or locking the post member 212 to the locking member 270, without employing specialized tools. The locking member 270 thus extends through and removably engages the socket member 250 in order to mechanically couple and electrically connect the contactor bus 110 to the bus bar 130. Furthermore, as the socket member 250 is connected to the bus bar 130, employing the lateral protrusions 274,276 in the grooves 258',260' advantageously aids in preventing the post member 212 from loosening over time.

Figure 6A:
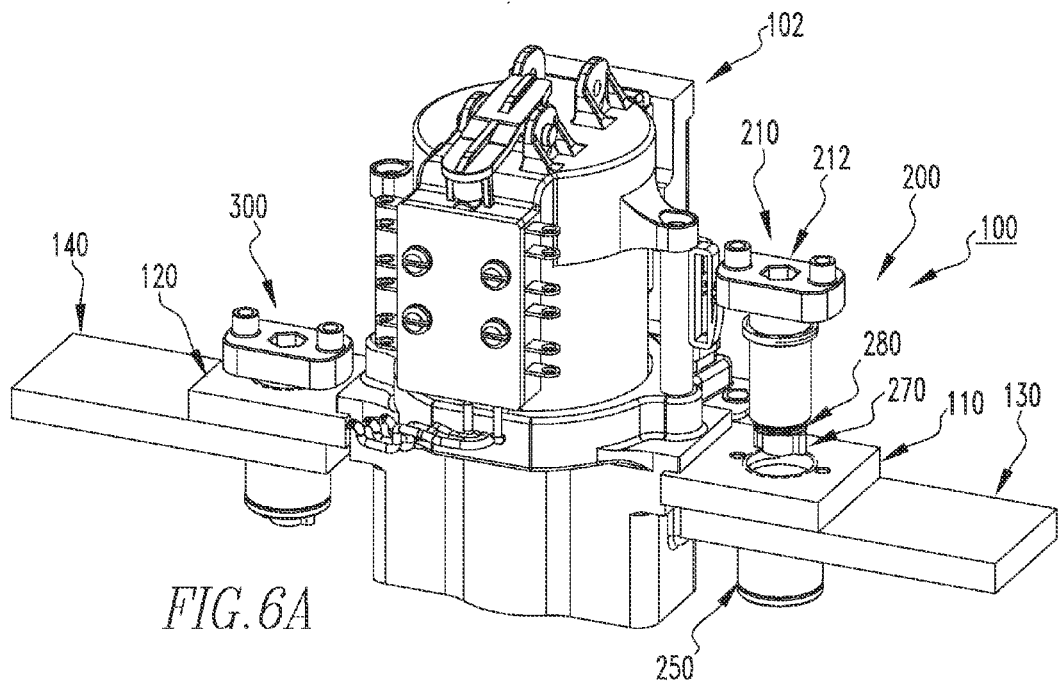
FIG. 6A is an isometric partially exploded view of the switching assembly and interconnect assembly therefor, in accordance with the disclosed concept.
Figure 6B:
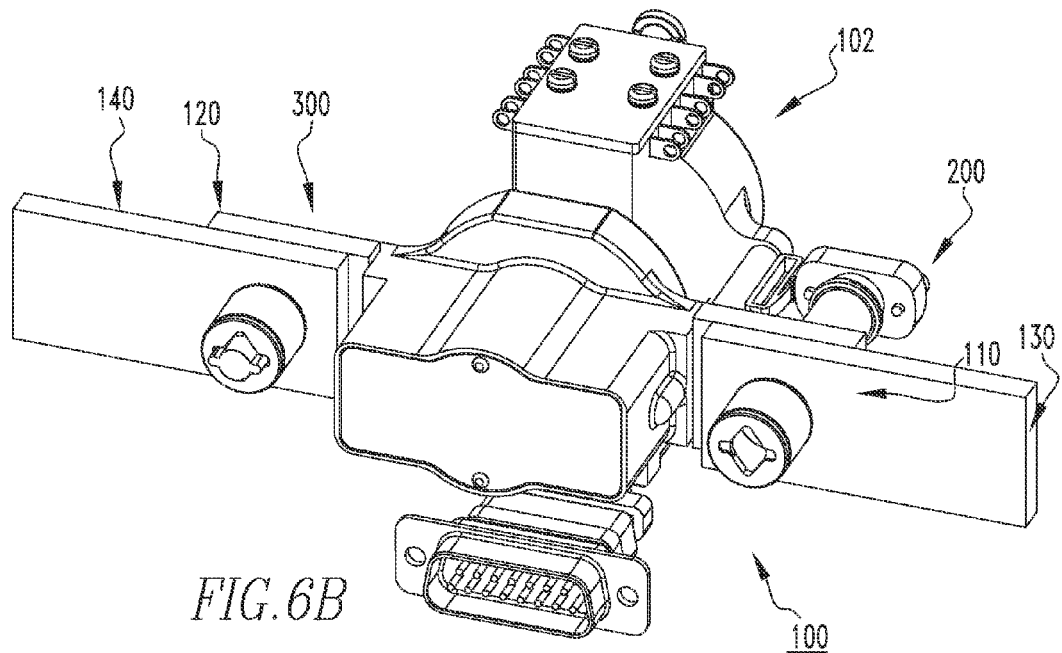
FIG. 6B is another isometric view of the switching assembly and interconnect assembly therefor of FIG. 6A.

FIGS. 6A, 6B and 7 show the complete switching assembly 100. As seen, the switching assembly 100 includes the aforementioned interconnect assembly 200 and another interconnect assembly 300, which is substantially identical to the interconnect assembly 200 discussed hereinabove. However, it is also within the scope of the disclosed concept to have different interconnect assemblies within a given switching assembly (not shown). Additionally, although the disclosed concept has been described in association with the single-phase power switching contactor 102, it is within the scope of the disclosed concept to employ the interconnect assembly 200, and/or suitable alternative interconnect assemblies (not shown), with multiple phase power switching contactors (not shown).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An interconnect assembly for a switching assembly, the switching assembly comprising a bus bar and an electromagnetic switching device having a contactor bus, the interconnect assembly being structured to mechanically couple and electrically connect the contactor bus to the bus bar, the interconnect assembly comprising:
   a socket member structured to engage the bus bar;
   a post assembly comprising a post member structured to extend through the contactor bus, at least a portion of the post member extending into the socket member; and
   a locking member disposed on the post member,
   wherein the locking member is structured to extend through and removably engage the socket member in order to mechanically couple and electrically connect the contactor bus to the bus bar,
   wherein the bus bar has a through hole, and
   wherein the socket member comprises an annular projection structured to engage the bus bar to retain the socket member in the through hole thereof.

2. The interconnect assembly of claim 1 wherein the socket member further comprises a receiving portion disposed opposite said annular projection; wherein said receiving portion includes a generally rhombus-shaped aperture having a first apex, a second apex, a third apex opposite the first apex, and a fourth apex; and wherein said receiving portion further includes a first groove disposed proximate said first apex and a second groove disposed proximate said third apex.

3. The interconnect assembly of claim 2 wherein said locking member comprises a first lateral protrusion and a second lateral protrusion disposed opposite the first lateral protrusion; wherein the first lateral protrusion is shaped to generally correspond with said first groove; and wherein the second lateral protrusion is shaped to generally correspond with said second groove.

4. The interconnect assembly of claim 1 wherein said post member has a head portion and an end portion opposite said head portion, said end portion having a recess; and wherein said locking member is structured to fit within said recess in order to mechanically couple the locking member to the post member.

5. The interconnect assembly of claim 1 wherein the post member comprises a head portion having a number of apertures extending therethrough, each aperture including a first portion having a first diameter and a second portion having a second diameter less than the first diameter of the first portion; and wherein the post assembly further comprises a dampening assembly, the dampening assembly comprising:
   a number of set screws, each being disposed in the first portion of a corresponding one of the apertures,
   a number of detent posts extending through the second portion of the corresponding one of the apertures, each detent post comprising a rounded end portion structured to engage the contactor bus and a head portion opposite the rounded end portion, the head portion being larger than the second diameter of the second portion, and
   a number of springs each being disposed between a corresponding one of the set screws and a corresponding one of the detent posts.

6. The interconnect assembly of claim 1 wherein the locking member comprises a number of threads; and wherein the post member comprises a threaded portion structured to engage the threads of the locking member.

7. The interconnect assembly of claim 1 wherein the post member further comprises a head portion having a hex socket disposed central thereto.

8. The interconnect assembly of claim 1 wherein the post member is not threadably coupled to the socket member.

9. An interconnect assembly for a switching assembly, the switching assembly comprising a bus bar and an electromagnetic switching device having a contactor bus, the interconnect assembly being structured to mechanically couple and electrically connect the contactor bus to the bus bar, the interconnect assembly comprising:
  a socket member structured to engage the bus bar, wherein the socket member comprises a first portion structured to engage the bus bar and a second portion opposite the first portion;
  a post assembly comprising a post member structured to extend through the contactor bus, at least a portion of the post member extending into the socket member, wherein the post member comprises a head portion and an end portion disposed opposite said head portion;
  a locking member disposed on the post member; and
  a number of compression springs disposed between the end portion of the post member and the second portion of the socket member, wherein said locking member extends through said number of compression springs, and
  wherein the locking member is structured to extend through and removably engage the socket member in order to mechanically couple and electrically connect the contactor bus to the bus bar.

10. A switching assembly comprising:
  a number of bus bars, wherein the corresponding one of the bus bars has a surface, a circular aperture extending through the corresponding one of the bus bars, and an annular groove being concentric with the circular aperture and extending from the surface partially into the corresponding one of the bus bars;
  an electromagnetic switching device comprising a number of contactor buses;
  at least one interconnect assembly for mechanically coupling and electrically connecting a corresponding one of the bus bars to a corresponding one of the contactor buses, the at least one interconnect assembly comprising:
    a socket member engaging the corresponding one of the bus bars;
    a post assembly comprising a post member extending through the corresponding one of the contactor buses, at least a portion of the post member extending into the socket member, wherein the socket member comprises an annular projection being concentric with the annular groove and welded to the corresponding one of the bus bars proximate the annular groove; and
    a locking member disposed on the post member, wherein the locking member extends through and removably engages the socket member in order to mechanically couple and electrically connect the corresponding one of the contactor buses to the corresponding one of the bus bars.

11. The switching assembly of claim 10 wherein the corresponding one of the bus bars has a through hole; and wherein the annular projection engages the corresponding one of the bus bars to retain the socket member in the through hole thereof.

12. The switching assembly of claim 11 wherein the socket member further comprises a receiving portion disposed opposite said annular projection; wherein said receiving portion includes a generally rhombus-shaped aperture having a first apex, a second apex, a third apex opposite the first apex, and a fourth apex; wherein said receiving portion further includes a first groove disposed proximate said first apex and a second groove disposed proximate said third apex; wherein said locking member comprises a first lateral protrusion and a second lateral protrusion disposed opposite the first lateral protrusion; wherein the first lateral protrusion is shaped to generally correspond with said first groove; and wherein the second lateral protrusion is shaped to generally correspond with said second groove.

13. The switching assembly of claim 11 wherein said post member has a head portion and an end portion opposite said head portion, said end portion having a recess; and wherein said locking member fits within said recess in order to mechanically couple the locking member to the post member.

14. The switching assembly of claim 10 wherein the socket member comprises a first portion structured to engage the corresponding one of the bus bars and a second portion opposite the first portion; wherein the post member comprises a head portion and an end portion disposed opposite said head portion; wherein the at least one interconnect assembly further comprises a number of compression springs disposed between the end portion of the post member and the second portion of the socket member; and wherein said locking member extends through said number of compression springs.

15. The switching assembly of claim 10 wherein the post member comprises a head portion having a number of apertures extending therethrough, each aperture including a first portion having a first diameter and a second portion having a second diameter less than the first diameter of the first portion; wherein the corresponding one of the bus bars has a number of depressions; and wherein the post assembly further comprises a dampening assembly, the dampening assembly comprising:
  a number of set screws, each being disposed in the first portion of a corresponding one of the apertures,
  a number of detent posts extending through the second portion of the corresponding one of the apertures, each detent post comprising a rounded end portion and a head portion opposite the rounded end portion, the rounded end portion extending into a corresponding one of the depressions and engaging the corresponding one of the contactor buses, the head portion being larger than the second diameter of the second portion, and
  a number of springs each being disposed between a corresponding one of the set screws and a corresponding one of the detent posts.

16. The switching assembly of claim 10 wherein the locking member comprises a number of threads; wherein the post member comprises a threaded portion engaging the threads of the locking member; and wherein the post member is not threadably coupled to the socket member.

17. The switching assembly of claim 10 wherein the post member further comprises a head portion having a hex socket disposed central thereto.

18. The switching assembly of claim 10 wherein the at least one interconnect assembly includes a first interconnect assembly and a second interconnect assembly; and wherein the electromagnetic switching device is a single-phase power switching contactor.

* * * * *